United States Patent
Tanaka et al.

(10) Patent No.: US 9,935,428 B2
(45) Date of Patent: Apr. 3, 2018

(54) SEMICONDUCTOR LIGHT-EMITTING ELEMENT AND METHOD FOR MANUFACTURING THE SAME

(71) Applicant: STANLEY ELECTRIC CO., LTD., Meguro-ku, Tokyo (JP)

(72) Inventors: Shinichi Tanaka, Kanagawa (JP); Kazuki Kiyohara, Kanagawa (JP); Yusuke Yokobayashi, Kanagawa (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 15/452,772

(22) Filed: Mar. 8, 2017

(65) Prior Publication Data

US 2017/0271847 A1    Sep. 21, 2017

(30) Foreign Application Priority Data

Mar. 15, 2016  (JP) ................... 2016-050812

(51) Int. Cl.

| | |
|---|---|
| *H01S 5/00* | (2006.01) |
| *H01S 5/183* | (2006.01) |
| *H01S 5/12* | (2006.01) |
| *H01L 33/00* | (2010.01) |
| *H01S 5/343* | (2006.01) |
| *H01S 5/187* | (2006.01) |

(52) U.S. Cl.
CPC ...... *H01S 5/18327* (2013.01); *H01L 33/0075* (2013.01); *H01S 5/1231* (2013.01); *H01S 5/183* (2013.01); *H01S 5/187* (2013.01); *H01S 5/18319* (2013.01); *H01S 5/34333* (2013.01); *H01L 2933/0058* (2013.01)

(58) Field of Classification Search
CPC .... H01S 5/1231; H01S 5/187; H01S 5/34333; H01S 5/183; H01S 5/18327; H01S 5/18319

See application file for complete search history.

(56) References Cited

U.S. PATENT DOCUMENTS

| | | | | |
|---|---|---|---|---|
| 8,908,731 B1 * | 12/2014 | Raring | ............... | F41H 13/0087 372/43.01 |
| 2010/0127236 A1 * | 5/2010 | Bour | ..................... | B82Y 20/00 257/13 |

FOREIGN PATENT DOCUMENTS

JP        07297476 A    11/1995

* cited by examiner

*Primary Examiner* — Kinam Park
(74) *Attorney, Agent, or Firm* — Holtz, Holtz & Volek PC

(57) ABSTRACT

A semiconductor light-emitting element has a distributed Bragg reflector that is grown by depositing an InAlN layer and a GaN layer a plurality of times in that order on a semipolar plane of a semiconductor substrate, and a semiconductor structure layer that is formed on the distributed Bragg reflector and includes an active layer. The InAlN layer has a plurality of projections on an interface with the GaN layer, and the InAlN layer has a low In region which is formed at the top of each of the plurality of projections and which is lower in In composition than the remaining region.

9 Claims, 5 Drawing Sheets

FIG.1A
FIG.1B
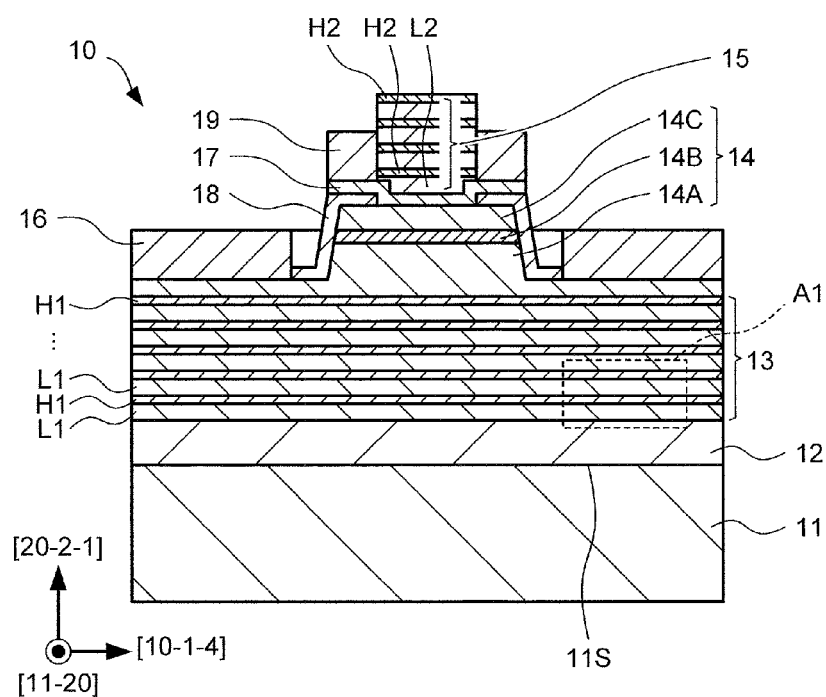
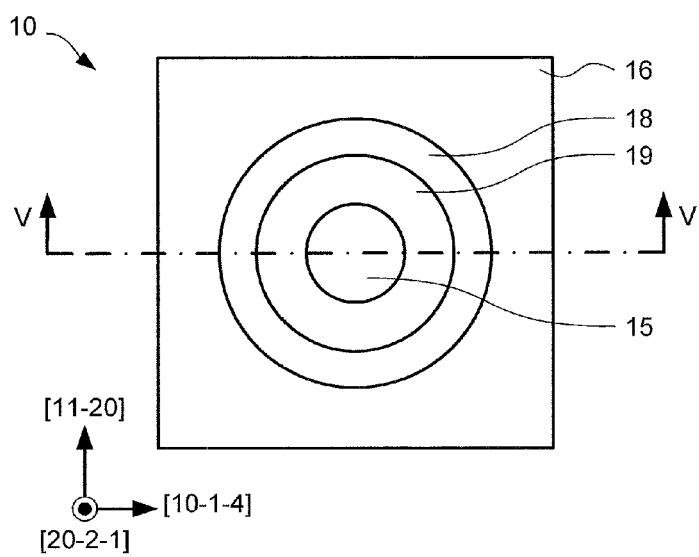

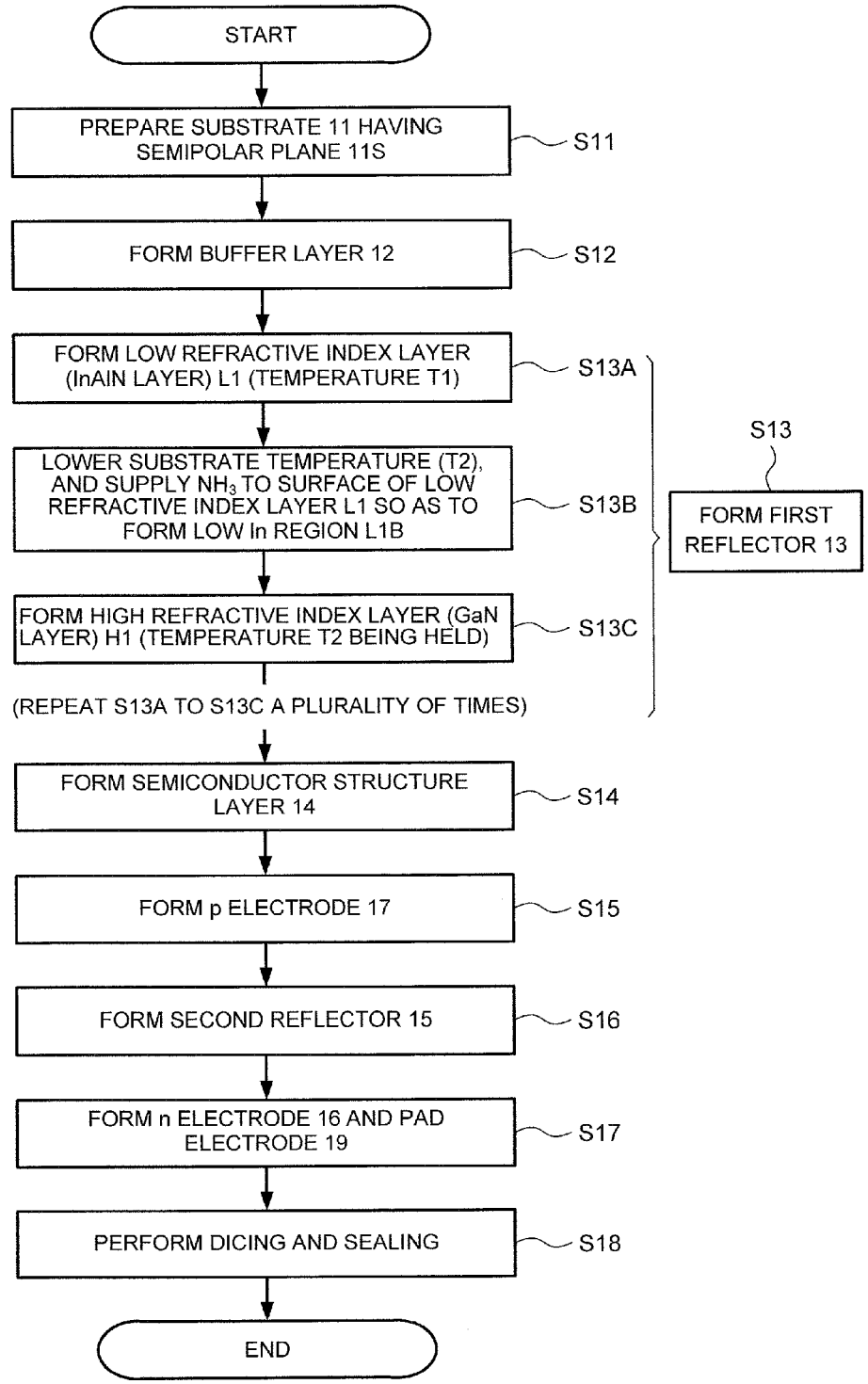

SEMICONDUCTOR LIGHT-EMITTING ELEMENT AND METHOD FOR MANUFACTURING THE SAME

BACKGROUND OF THE INVENTION

1. Field of the Invention

The present invention relates to a semiconductor light-emitting element such as a vertical cavity surface emitting laser (VCSEL) and a method for manufacturing the same.

2. Description of the Related Art

The vertical cavity surface emitting laser (hereinafter simply referred to as the surface emitting laser) is a semiconductor laser that is configured to oscillate light perpendicularly to a surface of the substrate so as to emit light in the direction perpendicular to the surface of the substrate. For example, disclosed in Patent Literature 1 (Japanese Patent Application Laid-Open No. Hei 07-297476) is a semiconductor laser device in which an active layer is sandwiched between Bragg reflectors, and the active layer is grown along an axis which is tilted by 5° to 10° or more from the [0001] axis.

For example, the surface emitting laser has reflectors that are opposed to each other with a light-emitting layer sandwiched therebetween, and the mutually opposed reflectors form a resonator. In the surface emitting laser, the reflector can be formed, for example, by alternately depositing, a plurality of times, two thin films having different refractive indices to each other. To reduce the lasing threshold value (operation voltage) of the surface emitting laser, it is preferable that the light reflectivity of the reflector should be high, and the light absorptivity of the reflector should be low.

Furthermore, to manufacture a semiconductor light-emitting element, without being limited to the surface emitting laser, so as to improve the extraction efficiency of light emitted from the element, there may be formed a light reflecting layer on a surface of the light-emitting layer opposite to the light extraction surface. This light reflecting layer also preferably has a high reflectivity.

On the other hand, to manufacture a light-emitting element from a hexagonal system semiconductor material, it is known that the semipolar plane of a substrate used for growth is employed as a crystal growth plane in order to grow a semiconductor structure layer on the semipolar plane. This is because the use of the semiconductor structure layer grown on the semipolar plane makes it possible to inhibit the occurrence of an inner electric field within the light-emitting layer and improve the efficiency of light emission as compared with a case where a semiconductor structure layer grown on a polar plane such as the c plane (i.e., (0001) plane) is used.

SUMMARY OF THE INVENTION

The present invention was developed in view of the aforementioned problems. It is therefore an object of the invention to provide a power-saving semiconductor light-emitting element which has a highly reflective reflector grown on a semipolar plane and which has high efficiency of light emission. It is also another object of the invention to provide a method for manufacturing the semiconductor light-emitting element, which enables the highly reflective reflector to be readily formed on the semipolar plane.

The semiconductor light-emitting element according to one aspect of the present invention includes: a distributed Bragg reflector grown by depositing an InAlN layer and a GaN layer a plurality of times in that order on a semipolar plane of a semiconductor substrate; and a semiconductor structure layer formed on the distributed Bragg reflector and including an active layer. The semiconductor light-emitting element is characterized in that the InAlN layer has a plurality of projections on an interface with the GaN layer, and has a low In region that is formed at the top of each of the plurality of projections and is lower in In composition than the remaining region.

Furthermore, the method for manufacturing a semiconductor light-emitting element according to another aspect of the present invention includes a step of forming, on a semipolar plane of a semiconductor substrate, a distributed Bragg reflector configured from an InAlN layer and a GaN layer, the InAlN layer having a surface with a plurality of projections, and a step of growing a semiconductor structure layer including an active layer on the distributed Bragg reflector. The distributed Bragg reflector is formed by repeating the following steps a plurality of times in the following order: a first step of growing the InAlN layer at a first temperature; a second step of supplying $NH_3$ to the surface of the InAlN layer at a second temperature lower than the first temperature so as to form a low In region, which is lower in In composition than the remaining region in the InAlN layer, at the top of each of the plurality of projections; and a third step of growing the GaN layer on the surface of the InAlN layer.

BRIEF DESCRIPTION OF THE DRAWINGS

FIG. 1A is a cross-sectional view illustrating a light-emitting element according to a first embodiment, and FIG. 1B is a top plan view illustrating the semiconductor light-emitting element according to the first embodiment;

FIG. 3 is a flow diagram showing each step of a method for manufacturing the semiconductor light-emitting element according to the first embodiment;

DETAILED DESCRIPTION OF THE INVENTION

Figure 2A:
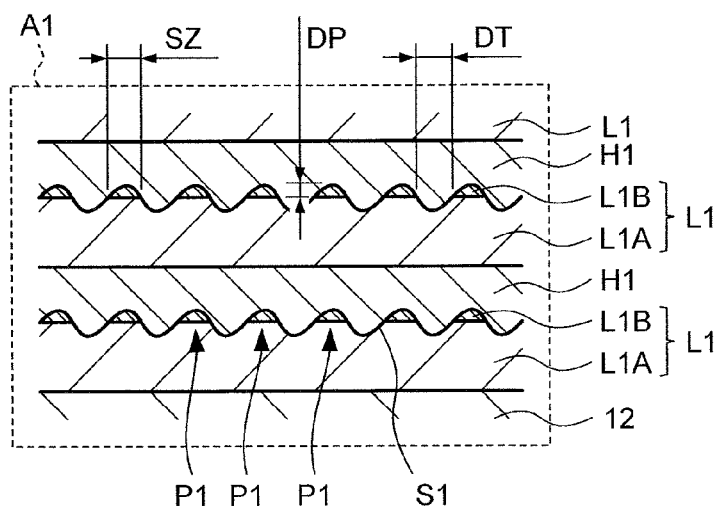
FIG. 2A is an enlarged cross-sectional view illustrating a first reflector of the semiconductor light-emitting element according to the first embodiment.

Now, an embodiment of the present invention will be described in more detail below.

First Embodiment

FIG. 1A is a cross-sectional view illustrating a semiconductor light-emitting element 10 according to a first embodiment of the present invention. In this embodiment, the semiconductor light-emitting element or device 10 is a vertical cavity surface emitting laser (VCSEL). The semiconductor laser 10 has first and second reflectors 13 and 15 disposed so as to be opposed to each other via a semiconductor structure layer 14 that includes an active layer 14B.

The semiconductor light-emitting element 10 is configured to include the first reflector 13, the semiconductor structure layer 14, and the second reflector 15, which are deposited on a substrate 11. More specifically, there is formed a buffer layer 12 on top of the substrate 11, and the first reflector 13 is formed on top of the buffer layer 12. Furthermore, the semiconductor structure layer 14 is formed on top of the first reflector 13, and the second reflector 15 is formed on top of the semiconductor structure layer 14.

The substrate 11 has a semipolar plane 11S as a crystal growth plane. That is, in this embodiment, the substrate 11 is a semipolar substrate which has the principal plane of the semipolar plane 11S. The semiconductor structure layer 14 is formed on the semipolar plane 11S of the substrate 11. In this embodiment, the substrate 11 is an n-type GaN substrate which has the [20-2-1] plane as a crystal growth plane. Furthermore, in this embodiment, the buffer layer 12 is a non-doped GaN layer.

The first reflector 13 has a structure configured such that a plurality of low refractive index layers L1 and high refractive index layers H1, which are deposited alternately one on another. In this embodiment, the first reflector 13 is a distributed Bragg reflector (DBR) that is grown by depositing an InAlN layer L1 and a GaN layer H1 a plurality of times in that order on the semipolar plane 11S of the semiconductor substrate 11. That is, the first reflector 13 is a distributed Bragg reflector formed from a semiconductor material. Note that in this embodiment, the low refractive index layers L1 and the high refractive index layers H1 are a non-doped semiconductor layer with no impurity doped.

The semiconductor structure layer 14 is made of a nitride-based semiconductor and has a composition, for example, $Al_xIn_yGa_{1-x-y}N$ ($0 \leq x \leq 1$, $0 \leq y \leq 1$, $0 \leq x+y \leq 1$). For example, an n-type semiconductor layer 14A has a composition of GaN and includes Si as an n-type impurity. The active layer 14B has a quantum well structure in which a well layer (not illustrated) having a composition of InGaN and a barrier layer (not illustrated) having a composition of GaN are alternately deposited. Furthermore, a p-type semiconductor layer 14C has a composition of GaN and includes Mg as a p-type impurity. Note that the semiconductor structure layer 14 may have an electron block layer (not illustrated) between the active layer 14B and the p-type semiconductor layer 14C and may also have a contact layer (not illustrated) on a surface of the p-type semiconductor layer 14C.

The semiconductor light-emitting element 10 has an n-electrode (i.e., first electrode) 16 and a p-electrode (i.e., second electrode) 17 which are formed on the n-type semiconductor layer 14A and the p-type semiconductor layer 14C, respectively. In this embodiment, there is provided a recessed portion extending from a surface of the p-type semiconductor layer 14C to the n-type semiconductor layer 14A, and the n-electrode 16 is formed on the bottom surface of the recessed portion of the n-type semiconductor layer 14A. Furthermore, there is provided an insulating film 18 having an opening on the surface of the p-type semiconductor layer 14C, and the p-electrode 17 is formed within the opening and on the insulating film 18. The p-electrode 17 is made of a material such as ITO or IZO which is translucent to light emitted from the active layer 14B. Note that there is formed a pad electrode 19 on the p-electrode 17.

The second reflector 15 is formed on the p-electrode 17. The second reflector 15 is disposed on the p-type semiconductor layer 14C to be opposed to the first reflector 13. In this embodiment, the second reflector 15 has a structure configured such that a low refractive index layer (or low refractive index dielectric layer) L2 made of $SiO_2$ and a high refractive index layer (or high refractive index dielectric layer) H2 made of, for example, $Nb_2O_5$ or $ZrO_2$ are each alternately deposited a plurality of times. In this embodiment, the second reflector 15 is a distributed Bragg reflector made of a dielectric material.

Now, referring to FIG. 1A, a description will be made to the outline of the light emission operation of the semiconductor light-emitting element 10. First, in the semiconductor light-emitting element 10, the first and second reflectors 13 and 15 that are opposed to each other constitute a resonator. Light emitted from the semiconductor structure layer 14 (i.e., the active layer 14B) is repeatedly reflected between the first and second reflectors 13 and 15 and then reaches a resonant state (or performs laser oscillation). Furthermore, part of the resonant light is transmitted through and extracted out of the second reflector 15. In this manner, the semiconductor light-emitting element 10 emits light in a direction perpendicular to the substrate 11.

FIG. 1B is a schematic top plan view of the semiconductor light-emitting element 10. Note that FIG. 1A is a cross-sectional view taken along line V-V of FIG. 1B. As shown in FIG. 1B, in this embodiment, the semiconductor light-emitting element 10 has a rectangular shape when viewed in a direction perpendicular to the substrate 11. Furthermore, the second reflector 15 is disposed at the center of the substrate 11. Furthermore, the pad electrode 19 is formed in an annular shape so as to surround the second reflector 15. Furthermore, the n-electrode 16 is formed outside the pad electrode 19 with the insulating film 18 therebetween.

FIG. 2A is a partly enlarged cross-sectional view illustrating an enlarged part of the first reflector 13. FIG. 2A is an enlarged cross-sectional view illustrating portion Al surrounded by a broken line in FIG. 1A. Note that a description will be made hereinafter to the case where the low refractive index layer L1 is an InAlN layer, and the high refractive index layer H1 is a GaN layer as an example. As illustrated in FIG. 2A, the InAlN layer L1 has, on the interface with the GaN layer H1, a recessed and projected structure surface S1 having a plurality of projections P1. That is, the surface of the InAlN layer L1 has a plurality of recesses and projections, and the GaN layer H1 is formed to embed the recesses and projections. The GaN layer H1 is preferably formed to have a flat surface.

Furthermore, the InAlN layer L1 is formed at the top of each of the projections P1 and has a low In-composition region (hereinafter, referred to as low In region) L1B that is lower in In composition than the remaining region. That is, the InAlN layer L1 has a high In-composition (hereinafter, referred to as high In region) region L1A having a typical In composition and the low In region L1B provided at the top of each of the projections P1. The low In region L1B is lower in In composition than the high In region L1A and is higher in Al composition than the high In region L1A. The InAlN layer L1 (i.e., the high In region L1A) has a composition that lattice-matches with the GaN layer H1. The low In region L1B preferably has an In composition (%) lower by 10% or more than the In composition (%) of the remaining region (i.e., the high In region L1A) of the InAlN layer L1. For example, in this embodiment, the high In region L1A has a composition of $In_{0.24}Al_{0.76}N$, and the low In region L1B has a composition of $In_{0.07}Al_{0.93}N$. In this instance, the low In region L1B has the In composition (7%) which is lower by 17% (i.e., lower more than 10%) than the In composition (24%) of the high In region L1A.

Figure 2B:
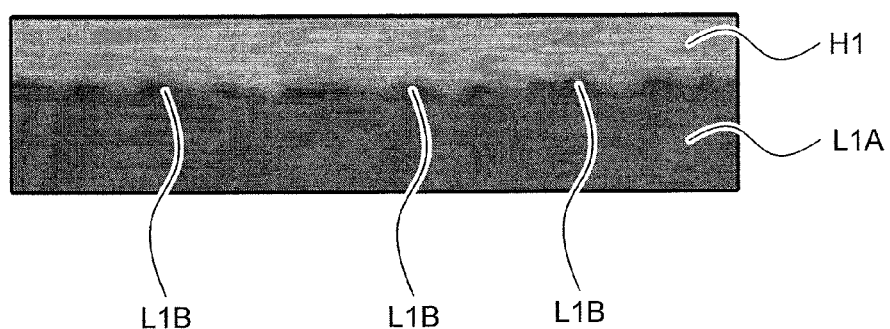
FIG. 2B is an observation image of a cross section of the first reflector.

FIG. 2B is an observation image of a cross section of the first reflector 13 taken by a scanning electron microscope (SEM). As shown in FIG. 2B, it is seen that a plurality of recesses and projections are formed on the interface of the InAlN layer L1 with the GaN layer H1 (in this embodiment, the interface toward the semiconductor structure layer 14), and a region low in In composition (i.e., the low In region L1B) is formed at the top of the projections within the InAlN layer L1.

Referring back to FIG. 2A, the InAlN layer L1 will be described below. The low In region L1B is provided at the top of each of the projections P1 with a predetermined mean size SZ and mean height (depth) DP. Furthermore, each of the low In regions L1B are mutually disposed at predetermined mean intervals DT. Note that herein the mean size SZ and the mean interval DT refer to the mean length and the placement separation of each of the low In regions L1B in a direction parallel to the semipolar plane 11S. Furthermore, the mean height DP refers to the mean length of each of the low In regions L1B in a direction perpendicular to the semipolar plane 11S.

In this embodiment, each of the low In regions L1B has a mean size SZ of 5 to 10 nm and a mean height DP of 2 to 4 nm. Furthermore, the low In regions L1B are disposed at mean intervals DT of 3 to 8 nm. Each of the projections P1 and each of the low In regions L1B are sufficiently small for the wavelength of emitted light (for example, 450 nm) from the active layer 14B. That is, each of the low In regions L1B has the mean size SZ and the mean height DP that are insensitive (i.e., make no optical contribution) to the emitted light from the active layer 14B, and the projections P1 do not absorb or scatter the emitted light.

Note that the projection 91 and the low In regions L1B can be checked, for example, for the existence and composition thereof by performing the analysis of an observation image, for example, by the SEM, the analysis of an observation image by the transmission electron microscope (TEM), and the energy dispersive X-ray spectrometry of the InAlN layer L1.

Figure 4A:
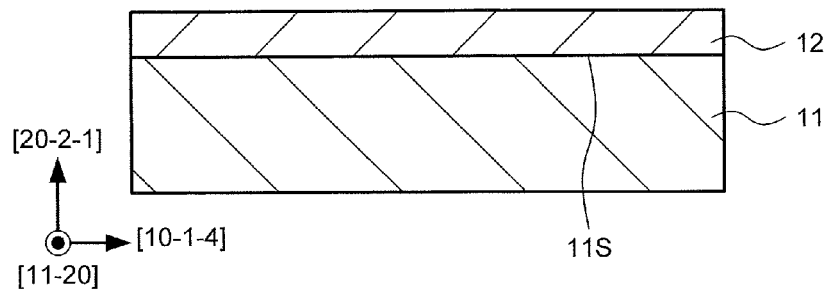
FIGS. 4A to 4C are cross-sectional views illustrating respective steps of a method for manufacturing the semiconductor light-emitting element according to the first embodiment.
Figure 4B:
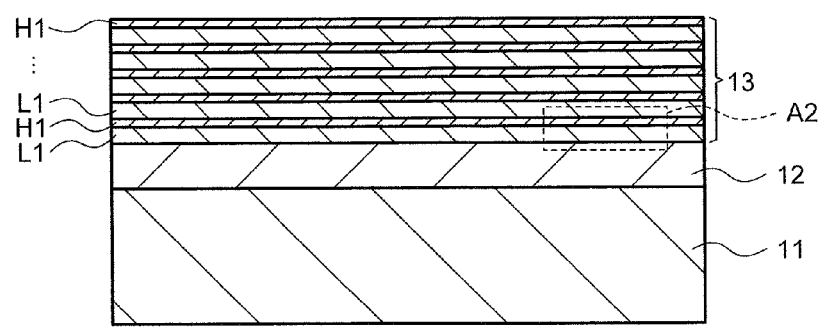
Figure 4C:
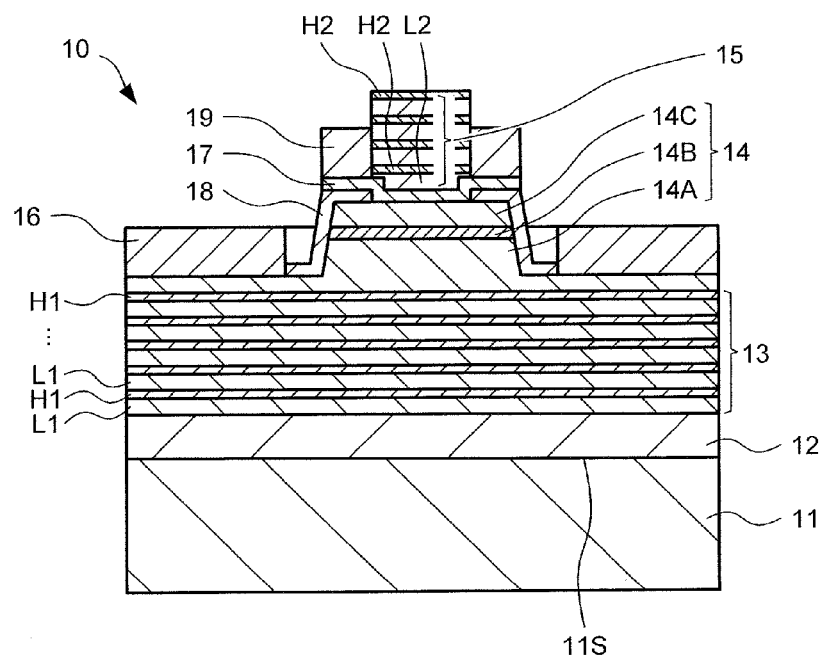

FIG. 3 is a flow diagram showing each step of a method for manufacturing the semiconductor light-emitting element 10. Furthermore, FIGS. 4A to 4C and FIGS. 5A to 5C are each a cross-sectional view illustrating a semiconductor wafer during the manufacturing of the semiconductor light-emitting element 10. Referring to FIG. 3, FIGS. 4A to 4C, and FIGS. 5A to 5C, the method for manufacturing the semiconductor light-emitting element 10 will be described below. Note that FIGS. 4A to 4C illustrate only one element region of a semiconductor wafer from which a plurality of semiconductor light-emitting elements 10 are manufactured. Furthermore, in this embodiment, the semiconductor light-emitting element 10 was manufactured by the metal organic chemical vapor deposition (MOCVD).

[Step of Forming the Buffer Layer 12]

First, the semiconductor substrate 11 that has the semipolar plane 11S as a principal plane is prepared (step S11). In this embodiment, a GaN substrate 11 having the (20-2-1) plane as the principal plane was prepared as the semipolar plane 11S.

Next, as shown in FIG. 4A, the buffer layer 12 is formed on the semipolar plane 11S of the substrate 11 (step S12). In this embodiment, a GaN layer in which no impurity was doped was grown as the buffer layer 12. In this embodiment, the temperature of the substrate at the time of the growth of the buffer layer 12 was 1223° C., and $NH_3$ and TMG (trimethyl gallium) were employed as the supply gas. Hereinafter, the substrate temperature and the growth temperature will refer to the surface temperature of the substrate 11 to be adjusted in the growth apparatus.

Subsequently, as shown in FIG. 4B, the InAlN layer (the low refractive index layer) L1 and the GaN layer (the high refractive index layer) H1 are alternately deposited, each a plurality of times, to form the first reflector (the distributed Bragg reflector) 13 (step S13). In this embodiment, the first reflector 13 was formed on the buffer layer 12 by alternately growing the InAlN layer L1 and the GaN layer H1, 30 layers for each.

Here, referring to FIGS. 5A to 5C, the step of forming the first reflector 13 will be described. In the step S13 of forming the first reflector 13, the semiconductor DBR to serve as the first reflector 13 is formed by repeating the following steps a plurality of times: a step of growing the InAlN layer L1 on the semipolar plane 11S at a first temperature T1 (the first step S13A); a step of lowering the temperature of the substrate 11 from the first temperature T1 to the second temperature T2 and then supplying $NH_3$ to a surface of the InAlN layer L1 (the second step S13B); and a step of growing the GaN layer H1 (the third step S13C).

More specifically, first, the InAlN layer L1 is grown on the surface of the buffer layer 12 formed on the semipolar plane 11S (step S13A). In this embodiment, the growth temperature of the InAlN layer L1 was 911° C., the supply gas employed was $NH_3$, trimethyl indium (TMI), and trimethyl aluminum (TMA).

Figure 5A:
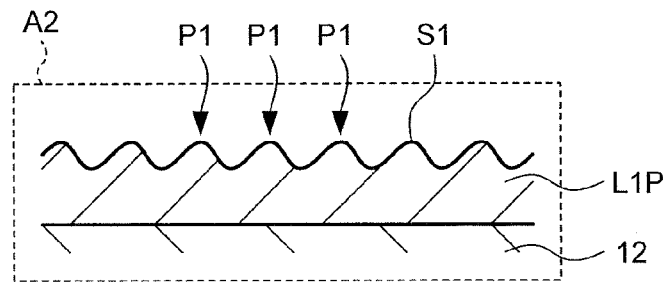
FIGS. 5A to 5C are cross-sectional views illustrating in detail a step of forming a first reflector in the method for manufacturing the semiconductor light-emitting element according to the first embodiment.

FIG. 5A is a schematic cross-sectional view illustrating the vicinity of the surface of the InAlN layer L1 of a semiconductor wafer after the step S13A. As shown in FIG. 5A, after the growth of the InAlN layer L1, there are formed a number of fine projections P1 on the surface S1 of the InAlN layer L1. That is, the InAlN layer L1 with the surface S1 having a recessed and projected structure having the fine projections P1 is formed. The projections P1 are formed at intervals of about 5 nm within the surface S1. Furthermore, the projections P1 have a mean height of about 3 nm.

Next, after the growth of the InAlN layer L1, the growth temperature (the substrate temperature) is lowered while $NH_3$ is being supplied to the semiconductor wafer (step S13B). That is, in the step S13A, the InAlN layer L1 is grown at the first temperature T1, and in the step S13B, $NH_3$ is supplied to the surface S1 of the InAlN layer L1 while the second temperature T2 lower than the first temperature T1 is being reached.

In this embodiment, after the supply of the supply gases TMI and TMA being supplied in the step S13A was stopped, the growth temperature was lowered from 911° C. to 900° C. More specifically, the supply gases were reduced to only $NH_3$, and the substrate temperature was lowered from 911° C. to 900° C. in about two minutes. Then, after that, $NH_3$ continued to be supplied while the substrate temperature was held at 900° C. for 5 minutes.

Figure 5B:
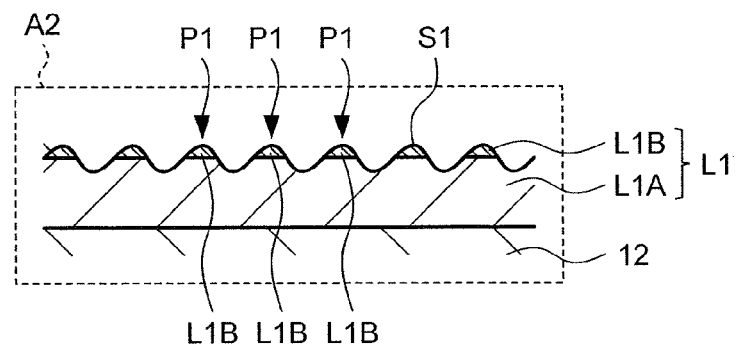
Figure 5C:
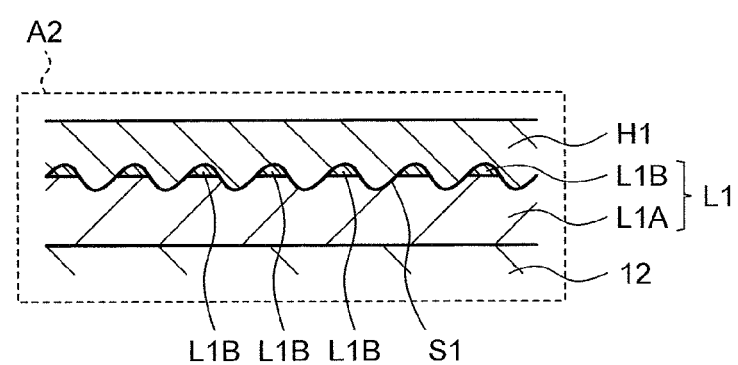

FIG. 5B is a schematic cross-sectional view illustrating the InAlN layer L1 after the step S13B. As shown in FIG. 5B, after the step S13S is performed, the In of the InAlN layer L1 at the top of the projections P1 is desorbed by a predetermined amount, so that the low In region L1B is formed. Furthermore, the high In region L1A that is relatively high in In composition is exposed around the low In region L1B. Thus, on the surface of the InAlN layer L1, the high In region (typical layer) L1A and the low In region L1B are formed.

Next, the GaN layer H1 is formed on the InAlN layer L1 (step S13C). In this embodiment, the growth temperature of the GaN layer H1 was lower than the growth temperature T1 of the InAlN layer L1, and the supply gas employed was $NH_3$ and TEG (triethyl gallium). In this embodiment, the growth temperature employed was 900° C. (the substrate temperature T2 in the step S13B was held). As shown in FIG. 5C, in this condition, the GaN layer H1 was formed on the surface S1 on the InAlN layer L1. From this point onward, the steps S13A to S13C were repeated a plurality of times to thereby form the first reflector 13 of a multi-layered InAlN/GaN film.

Here, the low In region L1B formed in the step S13B will be described below. The low In region L1B is formed only at the top of the projections P1 on the surface S1 of the InAlN layer L1. Furthermore, the low In region L1B formed at the top of the projections P1 enables the epitaxial growth of the GaN layer H1 to be normally formed in the step S13C that follows.

More specifically, first, since the InAlN layer is grown on the semipolar plane under an unstable crystalline state, portions having various crystal planes, that is, the projections P1 are formed on the surface S1. Thus, the portions of the projections P1, particularly, the tops thereof are polycrystal planes that inhibit the epitaxial growth of the GaN layer H1. Note that the polycrystal plane refers to a region at which a plurality of different crystal planes are densely exposed. An attempt to grow the GaN layer H1 on the projections P1 (on the polycrystal planes) would cause the GaN to grow in various directions from the various crystal planes, thereby preventing the epitaxial growth. That is, the GaN layer H1 cannot be formed even in spite of an attempt to form the GaN layer H1 immediately after the step S13A.

On the other hand, in this embodiment, the surface S1 of the InAlN layer L1 is processed with $NH_3$, thereby forming the low In region L1B at the top of the projections P1. The low In region L1B formed at the top of the projections P1 inhibits the growth of GaN from the projections P1, thus initiating the epitaxial growth of the GaN layer from a region on the surface S1 other than the projections P1, that is, from the exposed plane of the high In region L1A around the low In region L1B. Furthermore, the GaN of which crystal growth has started from the exposed plane of the high In region L1A further proceeds with the crystal growth in a plane direction so as to be bonded together above the projections P1 (the low In region L1B). Thus, the epitaxial growth of GaN is achieved on the MAIN layer L1, forming the GaN layer H1 that lattice-matches with the InAlN layer L1.

Next, as shown in FIG. 4C, the semiconductor structure layer 14 is formed on the first reflector 13 (step S14). In this embodiment, on the first reflector 13 (the high refractive index layers H1), the n-type semiconductor layer 14A, the active layer 14B, and the p-type semiconductor layer 14C were grown. Furthermore, in this embodiment, an n-GaN layer was formed as the n-type semiconductor layer 14A. Furthermore, as the active layer 14B, InGaN well layers and GaN barrier layers, three layers for each, were deposited to form a quantum well active layer. Furthermore, a p-AlGaN layer (an electron block layer), a p-GaN layer, and a p+GaN layer (a contact layer) were formed as the p-type semiconductor layer 14C.

Subsequently, the p-electrode 17 is formed on the p-type semiconductor layer 14C (step S15). In this embodiment, first, an insulating layer 18 was formed on the contact layer. In this embodiment, a $SiO_2$ layer having an opening was formed as the insulating layer 18 on the semiconductor structure layer 14. Then, as the p-electrode 17, an ITO layer was formed on the insulating layer 18 and in the opening.

Next, the second reflector 15 is formed on the p-electrode 17 (step S16). In this embodiment, the low refractive index layer L2 of $SiO_2$ and the high refractive index layers H2 of $Nb_2O_5$ were alternately deposited a plurality of times as the second reflector 15.

Subsequently, the n-electrode 16 and the pad electrode 19 are formed on the n-type semiconductor layer 14A and on the p-electrode 17, respectively (step S17). In this embodiment, the semiconductor structure layer 14 was partially removed, and a Ti layer, an Al layer, a Ti layer, and an Au layer were deposited on the exposed upper surface of the n-type semiconductor layer 14A, thereby forming the n-electrode 16. Then, the second reflector 15 was partially removed until part of the upper surface of the p-electrode 17 was exposed, and a Ti layer and an Au layer were deposited on the exposed upper surface of the p-electrode 17, thereby forming the pad electrode 19.

Subsequently, the semiconductor wafer including the substrate 11 was diced into individual elements, and the diced element was sealed (step S18). In this embodiment, semiconductor wafer was cut by dicing, and then the cut element was provided with conductor traces and sealed. In this manner, the semiconductor light-emitting element 10 is manufactured.

In this embodiment, on the semipolar plane 11S of the substrate 11, the first reflector 13 is formed on the semipolar plane 11S by repeating a plurality of times the following steps: a step of growing the InAlN layer L1 at the first temperature T1 (the first step S13A); a step of lowering the temperature of the substrate 11 from the first temperature T1 to the second temperature T2 and then supplying $NH_3$ to the surface S1 of the InAlN layer L1 (the second step S13B); and a step of growing the GaN layer H1 on the InAlN layer L1 (the third step S13C).

The first reflector 13 formed in this manner functions as a distributed Bragg reflector having a high reflectivity by setting the layer thicknesses of the low refractive index layer L1 and the high refractive index layer H1 depending on the emitted light from the active layer 14B. Furthermore, the semiconductor structure layer 14 formed on the semipolar plane 11S inhibits the occurrence of an inner electric field and enables a light emission operation with high efficiency of light emission. Thus, the semiconductor light-emitting element 10 serves as a surface emitting laser with a low threshold value.

Furthermore, as mentioned above, the first reflector 13 can be easily formed without requiring complicated steps. For example, there is no need to form an additional layer other than the low refractive index layers L1 and the high refractive index layers H1. It is thus possible to provide a method for manufacturing a semiconductor light-emitting element that enables a highly reflective reflector to be readily formed.

Note that the projections P1 and the low In regions L1B formed on the surface S1 of the InAlN layer L1 have a size insensitive to the emitted light from the active layer 14B (i.e., a sufficiently small size, for example, 10 nm or less) and exert no effects on the reflectivity. Furthermore, the inventors of the present application confirmed that the first reflector 13 has a reflectivity of 90% or more for light of a wavelength of 440 to 450 nm. That is, the inventors of the present application implemented a highly reflective semiconductor DBR in which the InAlN layer L1 and the GaN layer H1, which have a high refractive index difference, are deposited in a preferred manner on a semipolar plane.

Note that as mentioned above, the InAlN is epitaxially grown on the semipolar plane in an unstable state. Thus, after the growth of the InAlN layer L1, the In starts to desorb at the point of time at which the supply of the growth gas is stopped. Furthermore, the desorption of the In will progress more abruptly at higher growth temperatures, deteriorating the crystalline state of InAlN. Thus, in the step S13B, first, after the InAlN layer L1 is grown at the temperature T1, it is necessary to lower the growth temperature T1 to the temperature T2 and then supply $NH_3$.

Furthermore, in the step S13B, the growth temperature is preferably lowered within the range of 10° C. to 20° C. from that in the step S13A. That is, the second temperature T2 is preferably lower within the range of 10° C. to 20° C. than the first temperature T1. First, unless the growth temperature is lowered by 10° C. or more, the In of the surface S1 is excessively desorbed, deteriorating the crystalline state of the entire surface S1.

On the other hand, if the growth temperature is lowered by 20° C. or more, it will become difficult to grow the GaN layer H1 of a good crystalline quality. Furthermore, the step S13A is to be followed again after the step S13C. At this time, if there is an excessive difference in temperature (i.e., there is an excessive increase in temperature) from the then temperature, i.e., the first temperature T1, the In may readily desorb significantly in the entire InAlN layer L1.

Furthermore, as mentioned above, in the step S13C, that is, at the time of forming the GaN layer H1, it is preferable to hold the second temperature T2 when the low In region L1B is formed. This is because growing the GaN layer H1 under the condition in which the temperature of the substrate 11 at the time of forming the low In region L1B is held allows a good GaN layer H1 to be grown while the crystalline state of the InAlN layer L1 formed in the step S13B is being held.

For example, in general, the preferable growth temperature of GaN is higher than the growth temperature of InAlN. However, in this embodiment, that is because a change in the substrate temperature after the formation of the low In region L1B would cause the crystalline state of the surface S1 of the InAlN layer L1, that is, the surface state of the InAlN layer L1 suitable for the growth of the GaN layer H1 to be lost, preventing the GaN layer H1 from being grown in a preferred manner. Note that taking it into account that GaN is epitaxially grown in such a condition, it is preferable to employ TEG as the supply gas when the GaN layer H1 is grown in the step S13C.

Thus, it is preferable that after the step S13A is ended, the step S13B is performed by lowering the temperature of the substrate 11 within the range of 10° C. to 20° C., and the step S13C is performed while the temperature of the substrate 11 in the step S13B is being held. It is also preferable that to perform the step S13A after the step S13C is ended, the temperature of the substrate 11 should be raised within the range of 10° C. to 20° C.

Furthermore, taking it into account that the GaN layer H1 is grown in a preferred manner, the InAlN layer L1 is preferably configured such that the remaining region other than the low In region in the layer (the high In region L1A) has a composition that lattice-matches with the GaN layer H1, and the low In region L1B is lower in In composition than the remaining region by not less than 10%. In this embodiment, the InAlN layer L1 was formed so that the most part had a composition of $In_{0.24}Al_{0.76}N$, and the low In region L1B having a composition of $In_{0.07}Al_{0.93}N$ was formed on top of the surface of the recesses and projections. That is, in this embodiment, the low In region L1B is lower by 17% in In composition than the remaining region of the InAlN layer L1. This is because the formation of an In composition difference of 10% or more positively inhibits the growth of GaN from the low In region L1B, allowing the GaN layer H1 to be grown in a preferred manner from a portion of the high In region L1A (the portion lattice-matching with GaN) between the low In regions L1B.

Note that the inventors of the present application tried forming the first reflector 13 with the step S13B omitted. However, as mentioned above, the epitaxial growth of GaN was inhibited on the polycrystal plane at the top of the projections P1, so that a GaN layer (i.e., layer-shaped GaN) could not be formed on the InAlN layer. Furthermore, such a reflector had a low reflectivity.

Furthermore, in this embodiment, a description was made to the case where the first reflector 13 and the semiconductor structure layer 14 are formed on the (20-2-1) plane of the substrate 11. However, the first reflector 13 and the semiconductor structure layer 14 may only have to be formed on a semipolar plane. For example, the first reflector 13 may also be formed on the (20-21) plane, (11-22) plane, (10-1-1) plane, (30-31) plane, or (30-3-1) plane. That is, the semipolar plane 11S of the substrate 11 may be the (20-2-1) plane, (20-21) plane, (11-22) plane, (10-1-1) plane, (30-31) plane, or (30-3-1) plane.

Furthermore, the shape, size, and placement intervals of the aforementioned low In regions L1B are taken only as an example. Furthermore, the growth temperature and the supply gas employed for the growth of the first reflector 13 are also taken only as an example. Furthermore, each manufacturing step of the semiconductor light-emitting element 10 is taken only as an example. Furthermore, each electrode structure of the semiconductor light-emitting element 10 is taken only as an example.

Furthermore, in this embodiment, the semiconductor light-emitting element 10 includes the semiconductor substrate 11 and the buffer layer 12. However, the semiconductor light-emitting element 10 may not have to include the semiconductor substrate 11 and the buffer layer 12. For example, the semiconductor light-emitting element 10 may also be configured to have the first reflector 13 directly grown on the semipolar plane 11S of the semiconductor substrate 11 (i.e., to have no buffer layer 12). Furthermore, for example, the semiconductor light-emitting element 10 may only have to be configured to have the semiconductor substrate 11 removed (i.e., have no semiconductor substrate 11) after the first reflector 13 and the semiconductor structure layer 14 are grown. The semiconductor light-emitting element 10 may only have to be configured to have the first reflector 13 grown on the semipolar plane 11S of the semiconductor substrate 11.

Furthermore, in this embodiment, a description was made to the case where the semiconductor light-emitting element 10 was the surface emitting laser. That is, a description was made to the case where the active layer 14B is disposed so as to be sandwiched between the first and second reflectors 13 and 15. However, the semiconductor light-emitting element 10 does not need to have the second reflector 15. That is, the semiconductor light-emitting element 10 may only have to have the first reflector 13. For example, the semiconductor light-emitting element 10 may also be a light-emitting diode. The semiconductor light-emitting element 10 having the first reflector 13 makes it possible, for example, to provide a low power consumption light-emitting diode which employs a highly reflective distributed Bragg reflector and which has high efficiency of light extraction.

In this embodiment, the InAlN layer L1 and the GaN layer H1 are grown on the semipolar plane 11S of the semiconductor substrate 11 so as to form the distributed Bragg reflector 13. In this case, the substrate temperature is lowered before the growth of the GaN layer H1 to conduct a surface treatment with $NH_3$ on the InAlN layer L1. Thus, the highly reflective distributed Bragg reflector 13 can be readily formed on the semipolar plane 11S. Furthermore, the InAlN layer L1 formed in this manner has a plurality of fine projections P1, and has the low In region L1B at the top of each of the projections P1, Thus, it is possible to provide an energy-saving semiconductor light-emitting element 10 which has a high-quality distributed Bragg reflector 13 epitaxially grown in a preferred manner and which has high efficiency of light emission.

This application is based on a Japanese Patent Application No. 2016-50812 which is hereby incorporated by reference.

What is claimed is:

1. A semiconductor light-emitting element comprising:
    a distributed Bragg reflector grown by depositing an InAlN layer and a GaN layer a plurality of times in that order on a semipolar plane of a semiconductor substrate; and
    a semiconductor structure layer formed on the distributed Bragg reflector and including an active layer, wherein
    the InAlN layer has a plurality of projections on an interface with the GaN layer, and
    the InAlN layer has a low In region that is formed at a top of each of the plurality of projections and is lower in In composition than a remaining region.

2. The semiconductor light-emitting element according to claim 1, wherein
    the remaining region has a composition that lattice-matches with the GaN layer, and
    the low In region has an In composition lower than the remaining region by 10% or more.

3. The semiconductor light-emitting element according to claim 1, wherein the low In region of each of the projections has a mean size and a mean height that are insensitive to emitted light from the active layer.

4. The semiconductor light-emitting element according to claim 3, wherein
    the low In region of each of the projections has a mean size of 5 to 10 nm and a mean height of 2 to 4 nm, and the low In region of each of the projections is disposed at mean intervals of 3 to 8 nm.

5. The semiconductor light-emitting element according to claim 1, wherein
    the semipolar plane is any one selected from a (20-2-1) plane, a (20-21) plane, a (11-22) plane, a (10-1-1) plane, a (30-31) plane, and a (30-3-1) plane.

6. A method for manufacturing a semiconductor light-emitting element, the method comprising:
    a step of forming, on a semipolar plane of a semiconductor substrate, a distributed Bragg reflector configured from an InAlN layer and a GaN layer, the InAlN layer having a surface with a plurality of projections, the distributed Bragg reflector being formed by repeating, a plurality of times in the following order, a first step of growing the InAlN layer at a first temperature, a second step of supplying $NH_3$ to the surface of the InAlN layer at a second temperature lower than the first temperature so as to form a low In region, which is lower in In composition than a remaining region in the InAlN layer, at a top of each of the plurality of projections, and a third step of growing the GaN layer on the surface of the InAlN layer; and
    a step of growing a semiconductor structure layer including an active layer on the distributed Bragg reflector.

7. The method for manufacturing a semiconductor light-emitting element according to claim 6, wherein the second temperature is lower than the first temperature within the range of 10° C. to 20° C.

8. The method for manufacturing a semiconductor light-emitting element according to claim 6, wherein the third step is performed while the second temperature is being held.

9. The method for manufacturing a semiconductor light-emitting element according to claim 8, wherein, in the third step, the CaN layer is grown with TEG (triethyl gallium) employed as a supply gas.

* * * * *